(12) United States Patent
Villafuerte et al.

(10) Patent No.: US 11,913,576 B2
(45) Date of Patent: Feb. 27, 2024

(54) DEVICES AND METHODS FOR CONSTRAINING LIQUID COOLING TUBES IN LIQUID COOLING SERVERS

(71) Applicant: ZT GROUP INT'L, INC., Secaucus, NJ (US)

(72) Inventors: Anthony Villafuerte, Kearny, NJ (US); Mark Chubb, Tacoma, WA (US); Chen An, Bergenfield, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 81 days.

(21) Appl. No.: 17/673,472

(22) Filed: Feb. 16, 2022

(65) Prior Publication Data
US 2023/0258285 A1 Aug. 17, 2023

(51) Int. Cl.
*F16L 3/137* (2006.01)
*H05K 7/20* (2006.01)
*F28F 9/02* (2006.01)

(52) U.S. Cl.
CPC ............ *F16L 3/137* (2013.01); *F28F 9/0246* (2013.01); *H05K 7/20272* (2013.01); *H05K 7/20781* (2013.01)

(58) Field of Classification Search
CPC ..... F16L 3/137; F28F 9/0246; F28F 2225/04; H05K 7/20272; H05K 7/20781; H05K 7/20772; F28D 1/047; F28D 2021/0029
See application file for complete search history.

(56) References Cited

U.S. PATENT DOCUMENTS

2016/0100504 A1* 4/2016 Iwasaki ............. H05K 7/20781
165/84

FOREIGN PATENT DOCUMENTS

TW 202023350 A * 6/2020 ............ F28F 9/0258

* cited by examiner

*Primary Examiner* — Emmanuel E Duke
(74) *Attorney, Agent, or Firm* — POLSINELLI PC (57) ABSTRACT

A device for constraining liquid cooling tubes may include connecting a first tube connector and a second tube connector with a stretchable strip of flexible material. The first tube connector is configured to fluidly seal to a first end of a liquid cooling tube, and the second tube connector is configured to fluidly seal to a second end of the liquid cooling tube. The device may also include connecting the first tube connector to a first manifold and connecting the second tube connector to a second manifold when a computing device in a rack is in operation. The device may also include disconnecting the first tube connector to the first manifold and the second tube connector to the second manifold. The first tube connector and the second tube connector are constrained by the stretchable strip of flexible material when the computing device is moved out of the rack.

20 Claims, 8 Drawing Sheets

DEVICES AND METHODS FOR CONSTRAINING LIQUID COOLING TUBES IN LIQUID COOLING SERVERS

FIELD

The disclosure is directed to devices and methods for constraining liquid cooling tubes. In particular, the disclosure is directed to solutions to avoid interferences of tube connectors and liquid cooling tubes within a server rack when a server slides out of the server rack.

BACKGROUND

High-performance computing servers are energy-intensive and densely configured, which produces more heat in smaller spaces in a data center. As the rack density for servers increases, the data center may need more efficient and effective cooling technologies. Traditional air cooling is not a sustainable solution in these settings. Liquid cooling to the servers in the data center provides more efficient heat removal than traditional air cooling. The liquid cooling is to cool computer components (or full servers) using a thermally, but not electrically, conductive liquid (dielectric coolant) allowing higher heat transfer performance than air and many other benefits. For example, rack-level liquid cooling can achieve much higher efficiencies than traditional air cooling.

The servers may use a liquid cooling system including many cold plate tubes or liquid cooling tubes being connected to manifolds for cooling the servers. The cold plate tubes can transfer heat from surfaces with high heat loads to a cooling fluid or coolant used within the liquid cooling system. These servers include computing devices, such as central processing units (CPUs), graphics processing units (GPUs), among others, which can be cooled by a cooling fluid or coolant flowing through the cold plate tubes.

There remains a need for solutions to avoid damage to liquid cooling tubes when users need to service the servers.

BRIEF SUMMARY

In one aspect, the present technology is directed to constraining liquid cooling tubes. The present technology may include connecting a first tube connector and a second tube connector with a stretchable string of flexible material. The first tube connector is configured to fluidly seal to a first end of a liquid cooling tube, and the second tube connector is configured to fluidly seal to a second end of the liquid cooling tube. The present technology may also include connecting the first tube connector to a first manifold and connecting the second tube connector to a second manifold to extend the stretchable strip of flexible material when a computing device (e.g. server) in a rack is in operation. The present technology may also include disconnecting the first tube connector to the first manifold and the second tube connector to the second manifold to prepare for the computing device (e.g. server) to be serviced. The first tube connector and the second tube connector are constrained by the stretchable strip of flexible material when the computing device (e.g. server) is moved out of the rack. The present technology may further include unlocking the computing device (e.g. server) from the rack to allow the computing device to slide out of the rack.

In another aspect, a device is provided for constraining liquid cooling tubes. The device may include a stretchable strip of flexible material coupled to a first tube connector and a second tube connector. The first tube connector is configured to connect to a first end of a liquid cooling tube, and the second tube connector is configured to connect to a second end of the liquid cooling tube. The stretchable strip of flexible material is configured to be in a stretch mode when the first tube connector is attached to a first manifold and the second tube connector is attached to a second manifold positioned at a fixed distance from the first manifold. The stretchable strip of flexible material is configured to be in a relaxed mode when the first tube connector is detached from the first manifold and the second tube connector is detached from the second manifold.

Additional aspects, embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Conventional cold plate liquid cooling tubes for the servers are not constrained from traveling out of rear rack areas. The liquid cooling tubes have connection ends to manifolds. The connection ends may face conflicts with the rack posts when users service the servers and may cause interference with the rack posts. The connection ends of the liquid cooling tubes may be crushed with the rack posts when the users push the servers into the rack.

Figure 1:
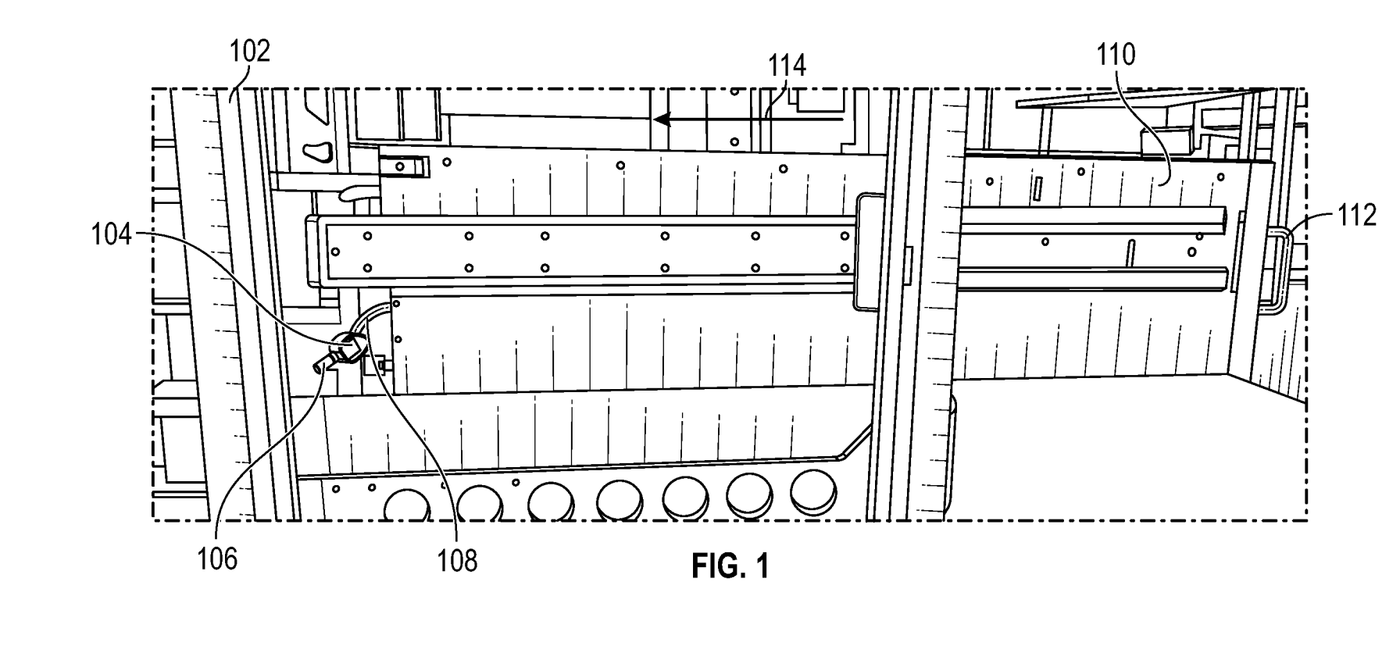
FIG. 1 is a side perspective view of a rack with a server partially out of the rack in accordance with an embodiment of the disclosure.

FIG. 1 is a side perspective view of a rack with a server partially out of the rack in accordance with an embodiment of the disclosure. A rack 102 is a metal frame structure that can be used to house multiple computing components in a single frame. The server is a hardware assembly that plugs communicating modules together (like input, output, CPU, power supply, communication, and additional function modules) in a single frame. For example, a server rack may hold multiple servers in a single frame. The server rack is commonly used in data centers. The server rack can be designed to make operations significantly more efficient, while also reducing the amount of space needed in the data center.

As shown in FIG. 1, a tube connector 104 that connects to a plastic tube 108 is not constrained. The plastic tube 108 is a connection end of the cold plate tube 200. The tube connector 104 and the plastic tube 108 may interfere with posts of the rack 102. For example, when the user pushes a server 110 into the rack by using handle 112 after the user services the server, the tube connectors 104 and the plastic tube 108 or tube ends may conflict with side rack posts and possibly damage the plastic tubes 108 or sleeves and create kinks by squeezing the plastic tubes 108 or sleeves against the rack post edges, which may lead to leaking or may potentially worsen the liquid flow that goes through these plastic tubes 108. To constrain the plastic tubes 108 from being able to interfere with any rack components can prevent the plastic tubes from damaging when the user services the server.

The present technology implements solutions to constrain these tube ends such that the tubes do not conflict with any rack component when the servers travel out of the rear rack area for being serviced by users or when the servers move into the rack after being serviced. In some aspects, the present technology implements an effective mechanical solution to constrain connection ends of the liquid cooling tubes such that the connection ends would not interfere with any rack posts or other components when the server is serviced. The present technology implements solutions that eliminate the possible damages to the tube ends.

Figure 2:
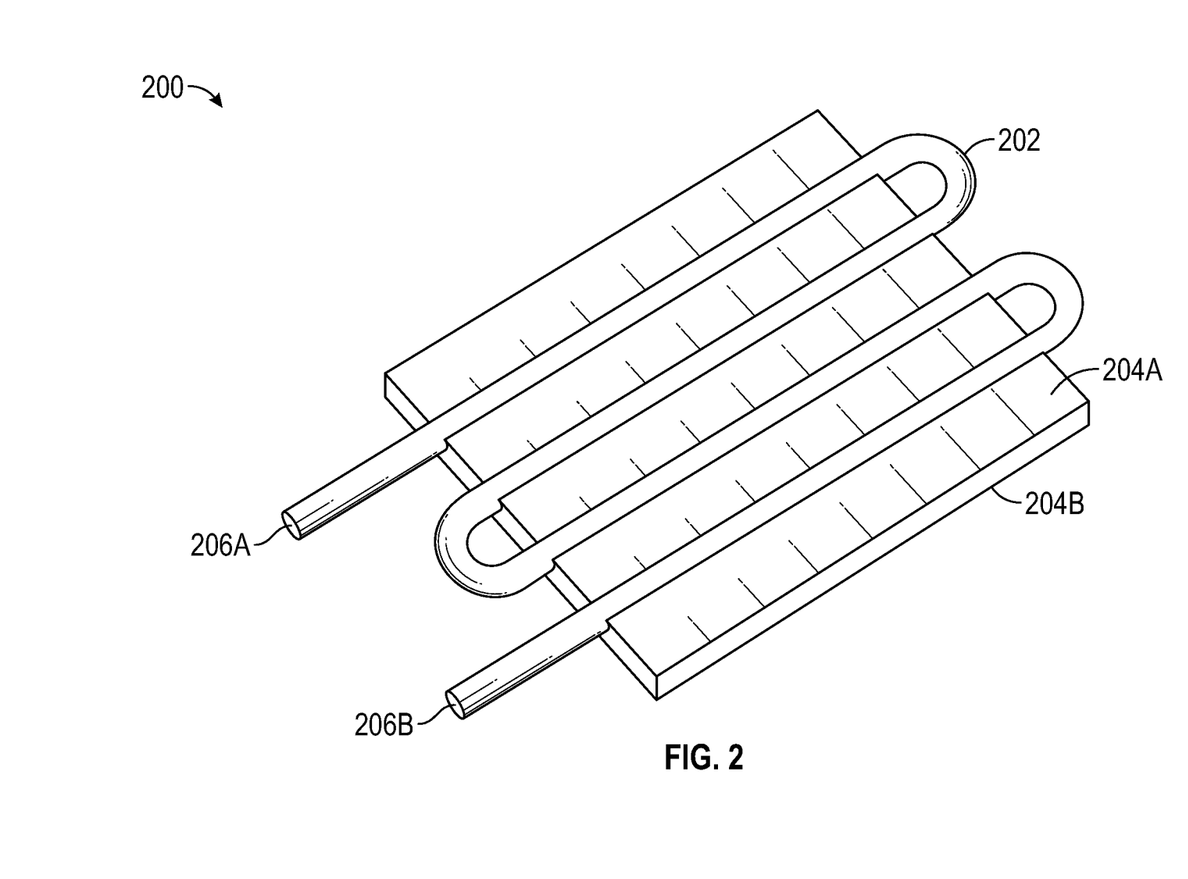
FIG. 2 is a diagram illustrating an example cold plate tube in a liquid cooling system for a server in accordance with an embodiment of the disclosure.

FIG. 2 is a diagram illustrating an example cold plate tube in a liquid cooling system for a server in accordance with an embodiment of the disclosure. As illustrated, a cold plate tube 200 may include a liquid cooling tube 202 placed between a top base plate 204A and a bottom base plate 204B. The liquid cooling tube 202 includes an inlet end 206A and an outlet end 206B for a cooling fluid or a coolant to flow through. For better heat conduction, liquid cooling tube 202 may be formed of copper. The top base plate 204A and bottom base plate 204B may be formed of aluminum. The liquid cooling tubes 202 are one of the main components that can transfer the fluid to cool down the CPUs or GPUs, among others.

The plastic tubes 108 may be used to connect tube connectors 104 to liquid cooling tubes 202 as illustrated in FIG. 2. The tube connectors 104 allow to connect or disconnect to the manifolds quickly. The manifolds include pipes that facilitate the transportation of the cooling fluid from one location to another location. The manifolds may be used in rack for cooling servers.

In some variations; the liquid cooling tube 202 may be a plastic tube.

Figure 3:
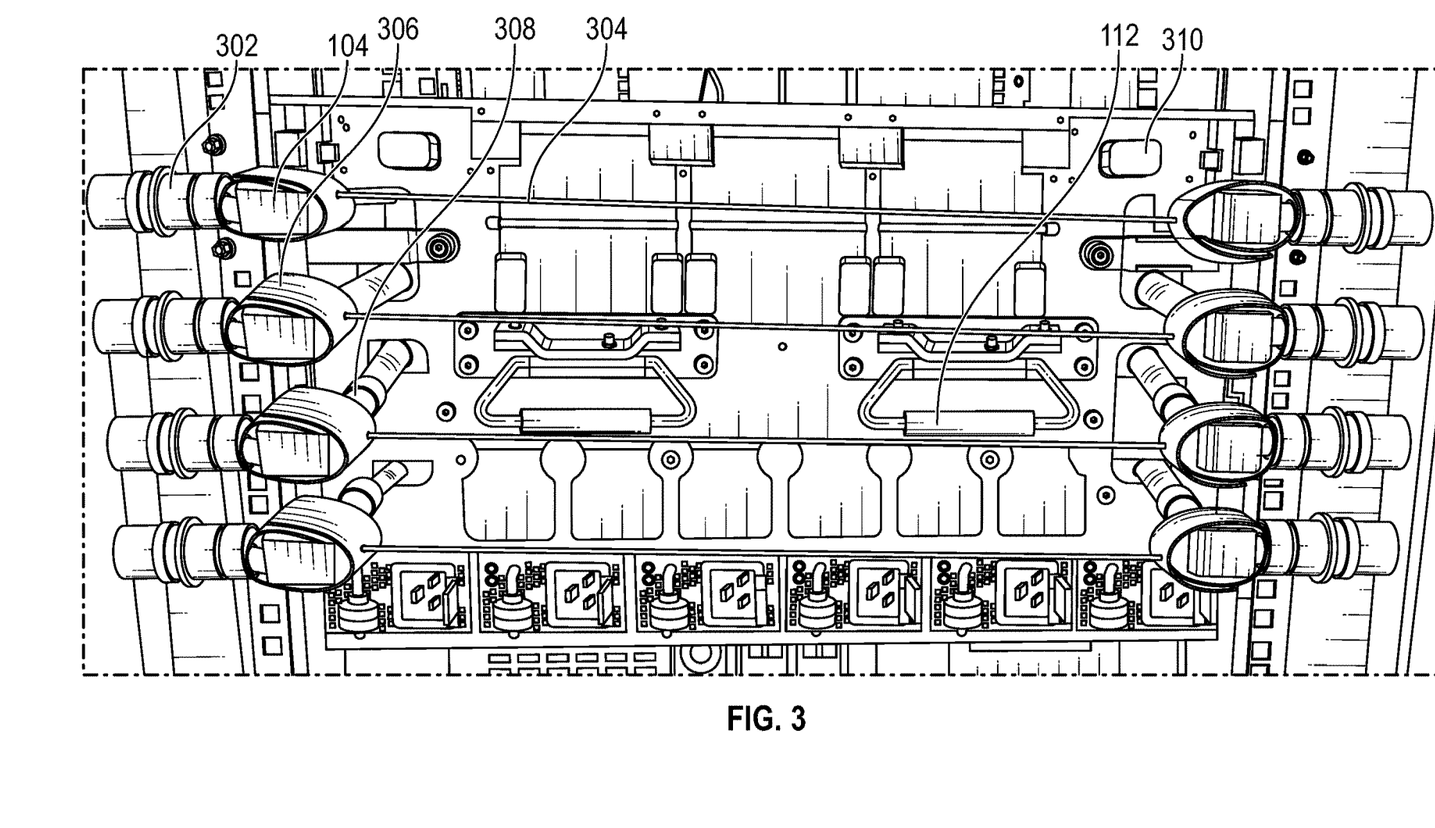
FIG. 3 is a rear perspective view of a server rack holding servers and cold plate tubes having inlets and outlets connected to manifolds in accordance with an embodiment of the disclosure.

FIG. 3 is a rear perspective view of a server rack holding servers and cold plate tubes having inlets and outlets connected to manifolds in accordance with an embodiment of the disclosure. As shown, tube connectors 104 are plugged into sockets 302A and 302B of first and second manifolds, respectively, such that the liquid cooling tubes 202 are connected from the manifolds. The first manifold on one side of the server may be for the cooling fluid to flow into the liquid cooling tube 202. The second manifold on another side of the server may be for the cooling fluid to flow out of the liquid cooling tube 202.

Figure 4:
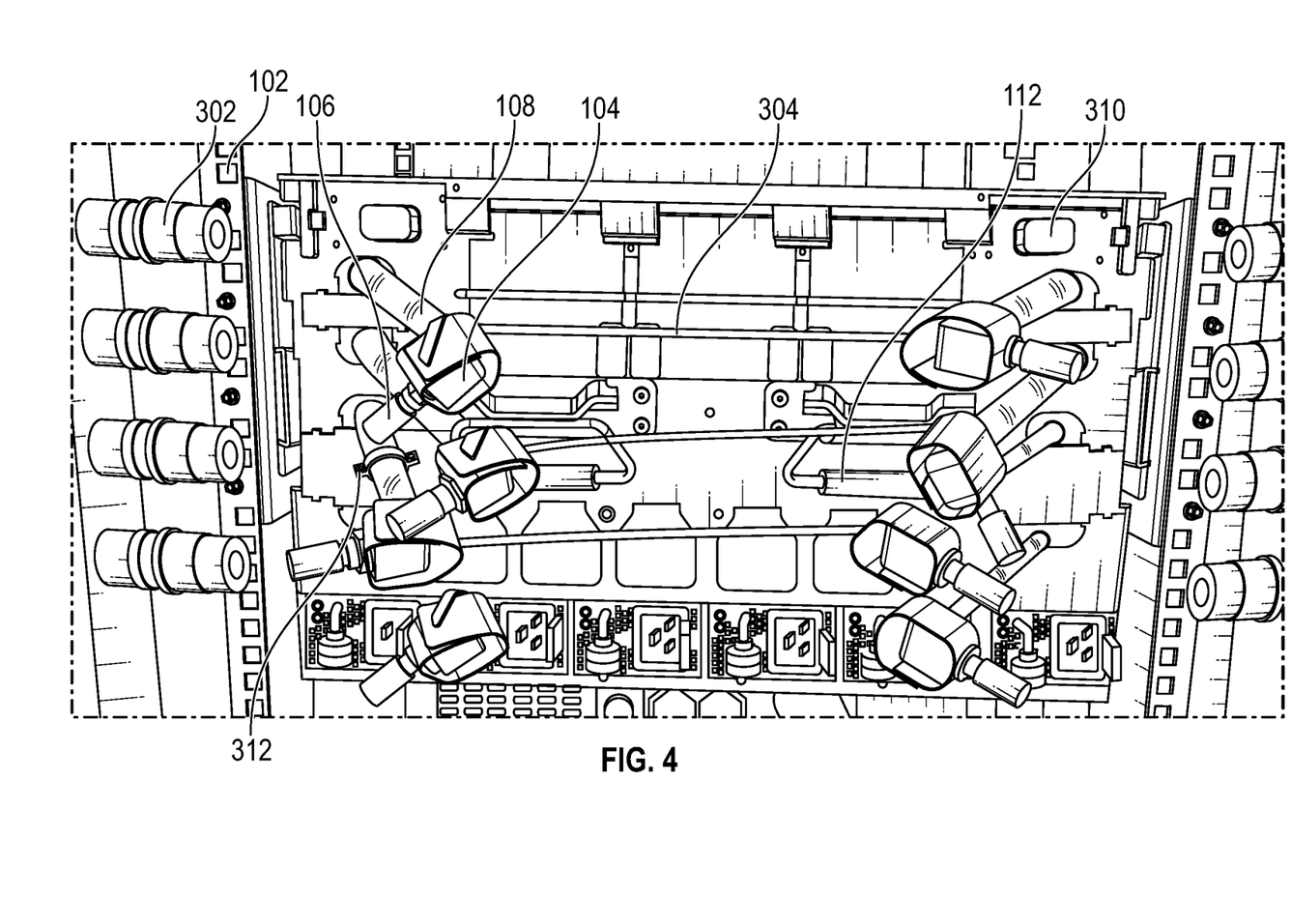
FIG. 4 is a rear perspective view of a server rack holding servers and cold plate tubes having inlets and outlets disconnected to manifolds in accordance with an embodiment of the disclosure.

Each manifold includes a number of sockets 302A or 302B configured to connect to a number of plugs 106 of tube connectors 104. Each socket of the manifold includes a hollow portion configured for the plug to fit into. For example, four sockets 302A and four sockets 302B are connected to plastic tubes 108 as illustrated in FIG. 4. The tube connectors 104 allow the liquid cooling tubes 202 to be in fluid communication with the manifolds. The tube connectors 104 can provide fast and easy connection and disconnection of fluid tubes. The tube connectors may be manually operated by a user. The tube connectors may also be referred to as quick connects or quick disconnects.

The tube connector 104 includes a first plug 106 and a second plug 308. The first plug 106 of the tube connector 104 is configured to be in fluid communication with the socket 302A or 302B of the manifold. The second plug 308 is also configured to be in fluid communication with the plastic tube 108 and also the liquid cooling tube 202.

The first plug 106 of tube connector 104 can disconnect or connect to socket 302A or 302B of the manifold. When the first and second tube connectors 104 are connected to the first and second manifolds, cooling fluid or coolant can be supplied from the first manifold to the inlet end 206A of the cold plate tube 202 for cooling the server, the cooling fluid flows out from the outlet end 206B of the cold plate tube 202 toward the second manifold.

In some variations, the plastic tube 108 and the liquid cooling tube 202 may be combined into a single plastic tube.

A stretchable strip of flexible material 304 is used to constrain the plastic tubes 108 that is attached to the tube connectors 104. The stretchable strip of flexible material 304 includes a first end attached to the first tube connector 104 and a second end attached to the second tube connector 104.

The stretchable strip of flexible material 304 (e.g. elastic string) can be stretched in an extension mode when the first and second tube connectors 104 are attached to the manifolds. When the tube connectors 104 are detached from the manifold, the stretchable strip of flexible material 304 is in an unstretched state. As such, the elastic string pulls the first tube connector and the second tube connector toward each other to constrain the tube connectors 104 and thus constrain the plastic tubes 108.

Also, two buttons 310 may be configured to lock or unlock the server. When a user intends to service the server, the user can use buttons 310 to unlock the server.

FIG. 4 is a rear perspective view of a server rack holding servers and cold plate tubes having inlets and outlets disconnected to manifolds in accordance with an embodiment of the disclosure. As shown in FIG. 4, tube connectors 104 are plugged out of sockets 302A and 302B to disconnect the cold plate tube 200 from the manifolds. Also, as illustrated in FIG. 4, clamp 312 may be used to reinforce the attachment of the plastic tube 108 to the second plug 308 of the tube connector 104.

The second socket 302B is positioned at a fixed distance from the first socket 302A on the opposite side of the server from the second socket 302B. The stretchable strip of flexible material 304 has a length in a relaxed state or non-extension state shorter than the fixed distance. When the first and second tube connectors 104 are disconnected from the respective sockets, the stretchable strip of flexible material 304 in a relaxed state constrains the tube connectors and tube ends 108 to avoid interference with the rack when the servers slide in and out from the rack. With the stretchable strip of flexible material 304, the tube connectors 104 and the plastic tubes 108 would not conflict when a user needs to pull out the server for service.

Figure 5:
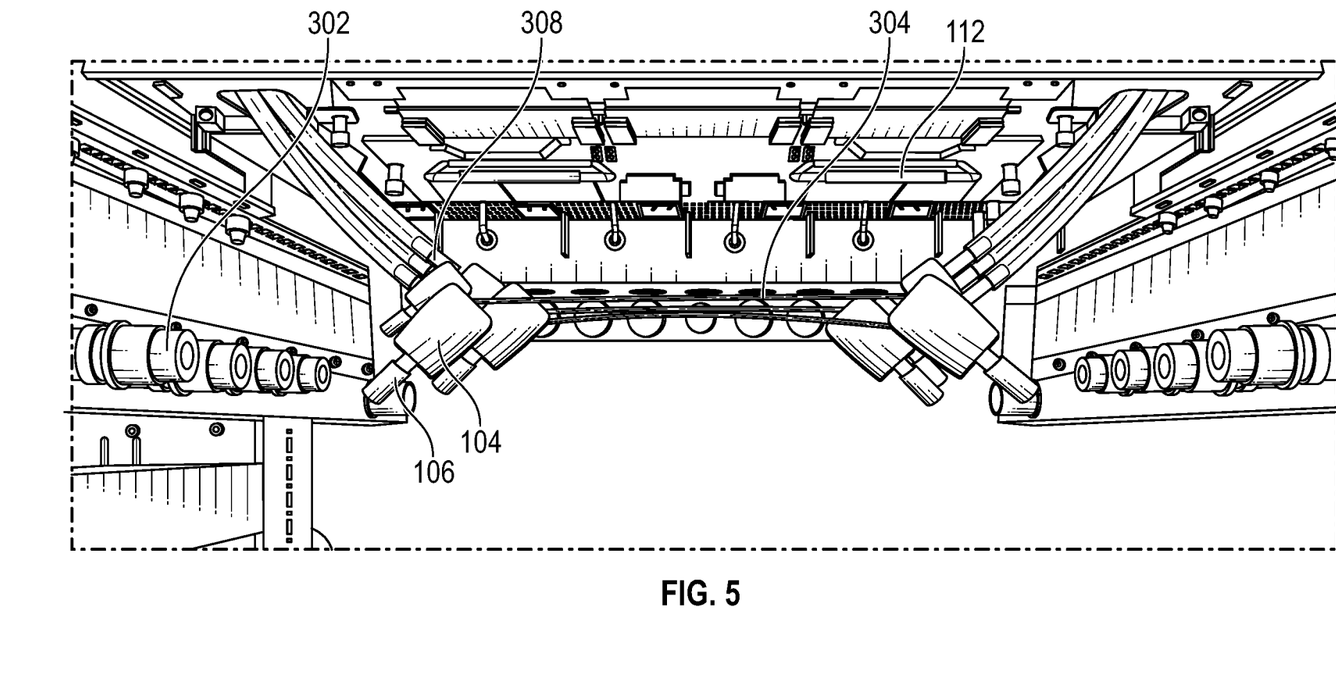
FIG. 5 is a top perspective view of the server rack of FIG. 4 with the cold plate tubes having inlets and outlets disconnected to manifolds in accordance with an embodiment of the disclosure.

FIG. 5 is a top perspective view of the server rack of FIG. 4 with the cold plate tubes having inlets and outlets disconnected to manifolds in accordance with an embodiment of the disclosure. When the tube connectors 104 are connected and disconnected from a manifold, the stretchable strip of flexible material 304 can constrain the tube connectors 104 and plastic tubes 108 that connect to the inlet ends 206A and outlet ends 206B of the liquid cooling tubes, which would not conflict with other components near the servers, such as rack posts, during the movements of the servers toward the rear rack area or into the rack. The servers can slide in and out from the rack without damaging the plastic tubes 108 that carry the cooling fluid for the liquid cooling system.

In some variations, the stretchable strip of flexible material may be formed of rubber or elastomer.

In some variations, the stretchable strip of flexible material may have a constant cross-section, which may be a round shape, a square shape, or a rectangular shape, among others.

In some aspects, the stretchable strip of flexible material may be a spring, which can operate in an extended mode or a relaxed mode. The spring can be configured to attach to the first tube connector and the second tube connector, such that the spring is in an extended state when the tube connector is attached to the manifold. The spring is in a relaxed mode when the tube connector is detached from the manifold.

In some variations, the spring may be a helical coil spring.

In some variations, the spring may be made of metal, such as steel, among others.

In some variations, the spring may be a tension or extension spring. The spring may operate with a tension load, so the spring stretches as the load is applied to it when the tube connectors are attached to the manifold.

When the spring is stretched from its resting position, the spring applies an opposing force approximately proportional to its change in length to pull the tube connectors apart.

The installation of the constraining stretchable strip of flexible material 304 allows smooth operations when the server is unlocked from the rack and smoothly slides out of the rear area of the rack.

Figure 6:
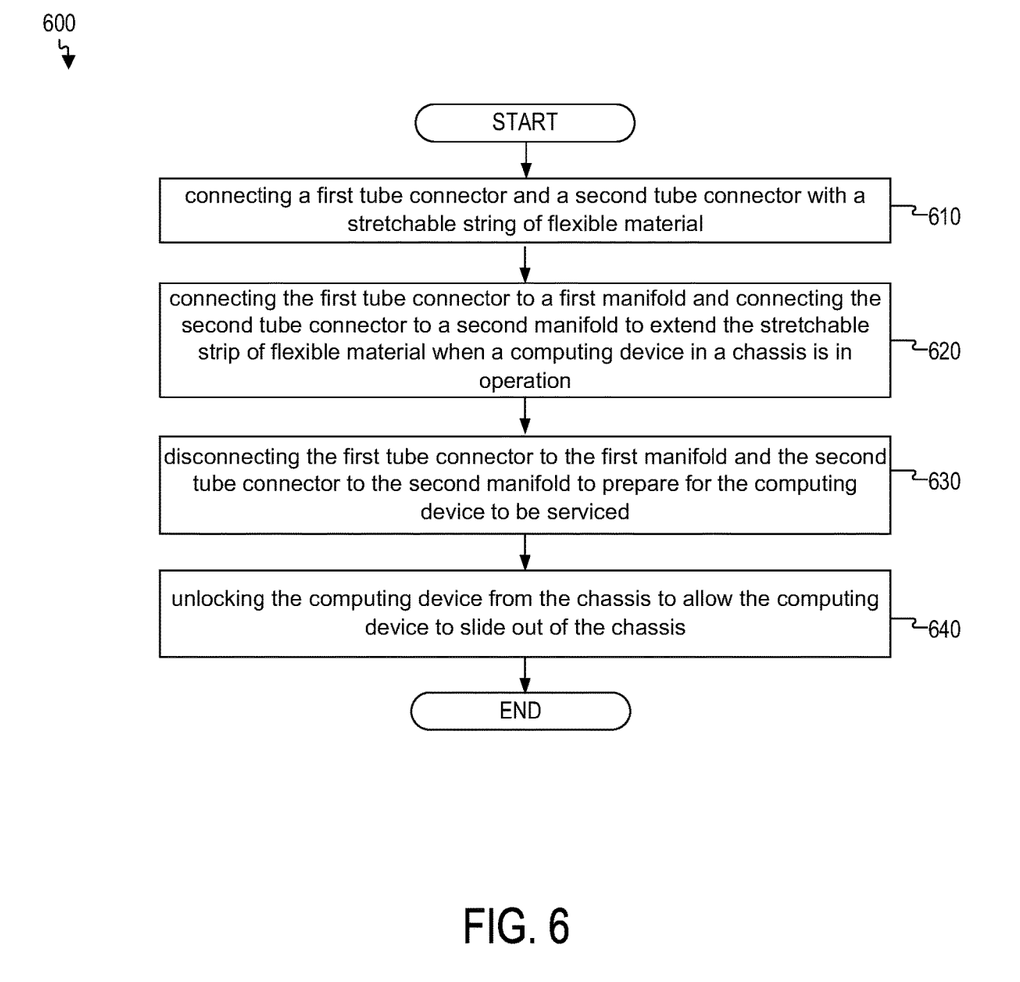
FIG. 6 is a flow chart illustrating the steps for safely moving the server into a rear area of the server rack of FIG. 1 in accordance with an embodiment of the disclosure.

FIG. 6 is a flow chart illustrating the steps for safely moving the server into a rear area of the server rack of FIG. 1 in accordance with an embodiment of the disclosure. Although the example method 600 depicts a particular sequence of operations, the sequence may be altered without departing from the scope of the present disclosure. For example, some of the operations depicted may be performed in parallel or in a different sequence that does not materially affect the function of method 600. In other examples, different components of an example device or system that implements method 600 may perform functions at substantially the same time or in a specific sequence.

According to some examples, method 600 may include connecting a first tube connector and a second tube connector with a stretchable string of flexible material at block 610. For example, a user may manually connect a first tube connector and a second tube connector with a stretchable string of flexible material. The first tube connector is configured to fluidly seal to a first end of a liquid cooling tube, and the second tube connector is configured to fluidly seal to a second end of the liquid cooling tube. Various ways of attachments of the stretchable string of flexible material to the tube connectors are provided in Examples.

According to some examples, method 600 may include connecting the first tube connector to a first manifold and connecting the second tube connector to a second manifold to extend the stretchable strip of flexible material when a computing device in a rack is in operation at block 620. For example, a user may connect the first tube connector to a first manifold and connect the second tube connector to a second manifold to extend the stretchable strip of flexible material when a computing device (e.g. server) in a rack is in operation.

According to some examples, method 600 may include disconnecting the first tube connector to the first manifold and the second tube connector to the second manifold to prepare for the computing device to be serviced at block 630. For example, the user may manually disconnect the first tube connector to the first manifold and the second tube connector to the second manifold to prepare for the computing device (e.g. server) to be serviced. The first tube connector and the second tube connector are constrained by the stretchable strip of flexible material when the computing device (e.g. server) is moved out of the rack.

According to some examples, method 600 may include unlocking the computing device from the rack to allow the computing device to slide out of the rack at block 640. For example, the user may unlock the computing device (e.g. server) from the rack by pressing button 310 as illustrated in FIG. 3 to allow the computing device to slide out of the rack.

According to some examples, method 600 may include supplying a coolant in the liquid cooling tube to cool the computing device when the first end of the liquid cooling tube is connected to the first manifold and the second end of the liquid cooling tube is connected to the second manifold. For example, the user may supply a coolant in the liquid cooling tube to cool the computing device when the first end of the liquid cooling tube is connected to the first manifold and the second end of the liquid cooling tube is connected to the second manifold.

EXAMPLES

The following examples are for illustration purposes only. It will be apparent to those skilled in the art that many modifications, both to materials and methods, may be practiced without departing from the scope of the disclosure.

The present technology implements example features that can constrain the tube ends from getting damaged. The example feature includes an elastic string. The force and direction of deformation generated by elastic deformation of the string are in a straight line with the connection direction of the tube connector. The elastic string allows the tube connector to travel the distance necessary to engage in the connection position on the manifold. The example feature also includes two Velcro straps, which can attach the elastic string to the tube connectors. With the example feature, the tube ends can avoid being damaged when a user services the server.

It will be appreciated by those skilled in the art that the tube connectors or connecting features may vary, but they are constrained when the tube connectors are unplugged from the manifolds.

Figure 7:
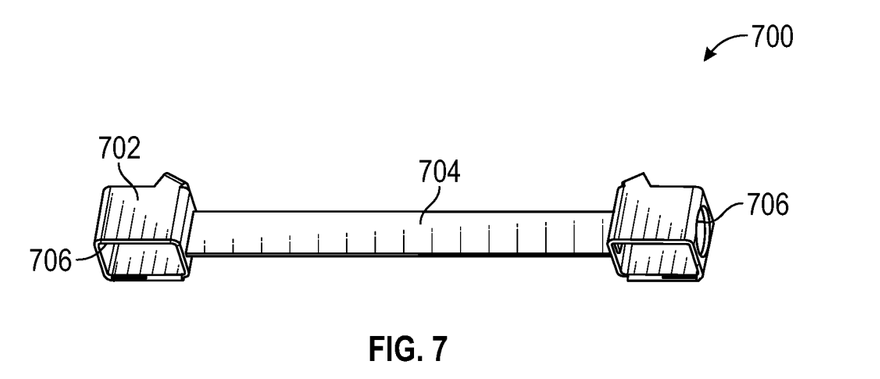
FIG. 7 is a perspective view of an example elastic belt connected to two holders for tube connectors prior to assembly in accordance with an embodiment of the disclosure.

FIG. 7 is a perspective view of an example elastic belt connected to two holders for tube connectors prior to assembly in accordance with an embodiment of the disclosure. As shown in FIG. 7, an elastic belt assembly 700 may include an elastic belt 704 attached between two holders 702. Each holder 702 has an opening 706 configured for a plug of a tube connector to pass through. The elastic belt 702 is a ribbon in a rectangular shape.

In some embodiments, The holders 702 may be formed of straps that can wear on the tube connectors to hold the tube connectors from moving out of the rear rack area. The example elastic belt can be attached to the tube connector with straps. The straps may be hook-and-loop fasteners including two lineal fabric strips which are attached to the opposing surfaces to be fastened. The straps may include hook and loop fasteners, and may hold the belt 704 and the tube connectors 104 together.

Figure 8:
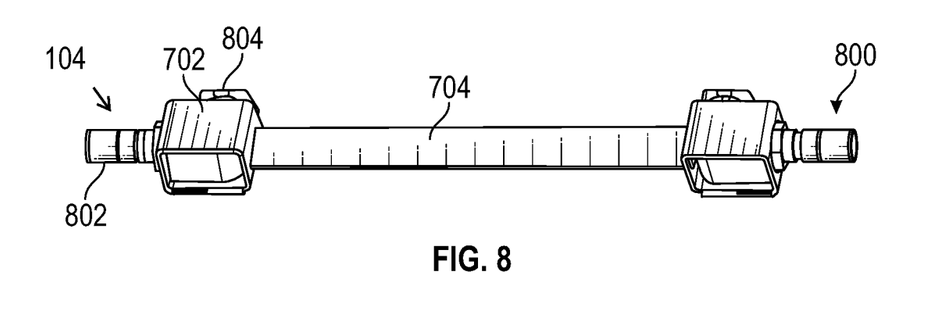
FIG. 8 is a perspective view of the example elastic belt with the two holders of FIG. 7 after assembled with tube connectors in accordance with an embodiment of the disclosure.

FIG. 8 is a perspective view of the example elastic belt with the two holders of FIG. 7 after assembled with tube connectors in accordance with an embodiment of the disclosure. As illustrated in FIG. 8, a tube connector assembly 800 may include the elastic belt 704 and first and second tube connectors 104 in each respective holder 702. Each tube connector 104 includes a first connecting end 802 (e.g. plug) configured to pass through holes 706 of the holders 702 and connect to sockets 302A and 302B. Each tube connector 104 may also include a second connecting end 804, which may be at an angle from the first connecting end 802, such as 90 degrees. The second connecting end 804 is configured for the plastic tube 108 to sleeve onto and fluidly seal to the plastic tube 108.

In some embodiments, an elastic string may be attached to the tube connectors. Depending upon the shape of the elastic string, the string may be attached to the tube connectors in different ways. The cost may vary with different attachments. For example, a round elastic string has two ends. Each end of the elastic string may be knotted to attach to the strap, e.g. Velcro strap, which is wrapped around each tube connector to attach elastic string to the tube connector. The string may be a strip, which may be stitched to the strap.

Figure 9:
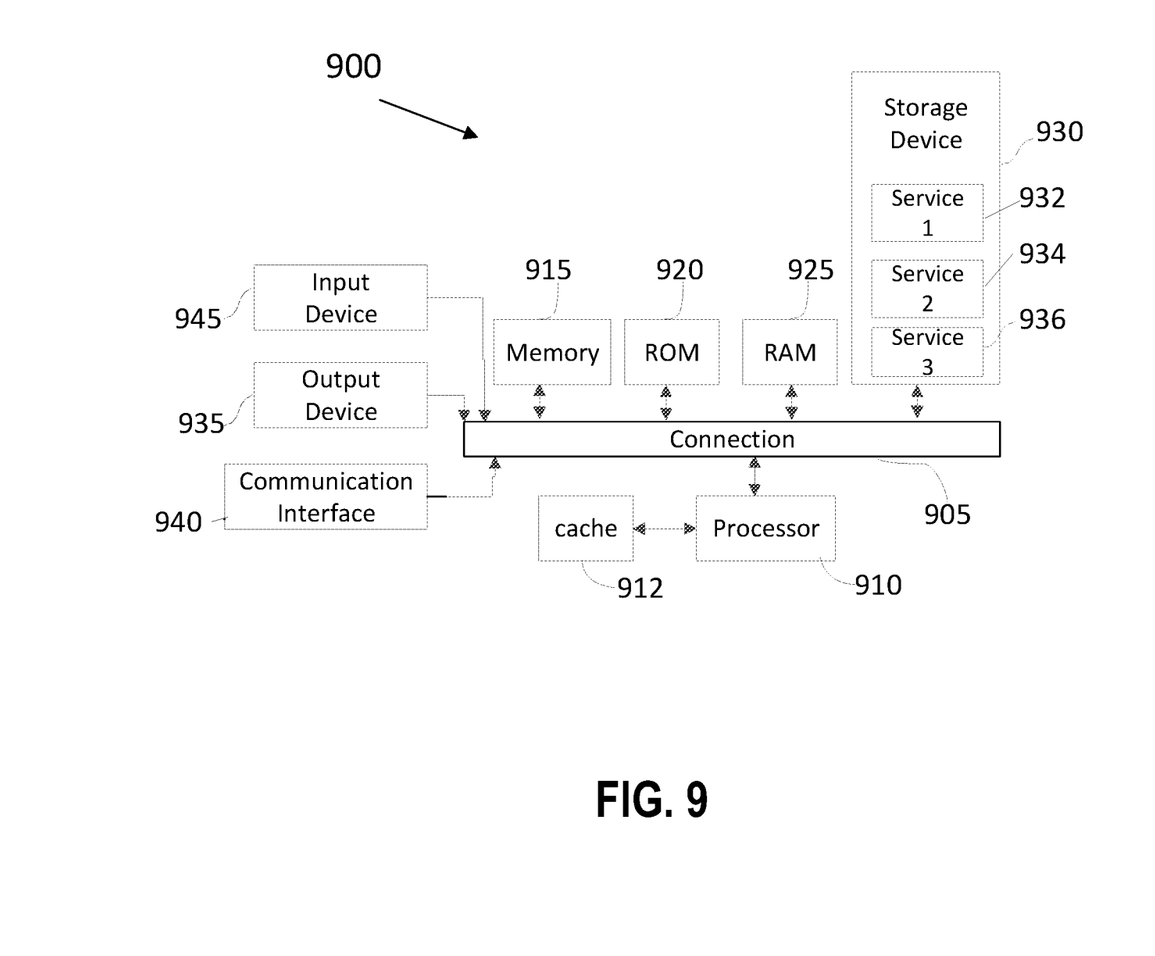
FIG. 9 shows an example of a system for implementing certain aspects of the present technology.

FIG. 9 shows an example of computing system 900, which can be for example any computing device making up the server or any component thereof in which the components of the system are in communication with each other using connection 905. Connection 905 can be a physical connection via a bus, or a direct connection into processor 910, such as in a chipset architecture. Connection 905 can also be a virtual connection, a networked connection, or a logical connection.

In some embodiments, computing system 900 is a distributed system in which the functions described in this disclosure can be distributed within a data center, multiple data centers, a peer network, etc. In some embodiments, one or more of the described system components represents many such components each performing some or all of the function for which the component is described. In some embodiments, the components can be physical or virtual devices.

Computing system 900 includes at least one processing unit (CPU or processor) 910 and connection 905 that couples various system components including system memory 915, such as read-only memory (ROM) 920 and random-access memory (RAM) 925 to processor 910. Computing system 900 can include a cache of high-speed memory 912 connected directly with, close to, or integrated as part of processor 910.

Processor 910 can include any general-purpose processor and a hardware service or software service, such as services 932, 934, and 936 stored in storage device 930, configured to control processor 910 as well as a special-purpose processor where software instructions are incorporated into the actual processor design. Processor 910 may essentially be a completely self-contained computing system, containing multiple cores or processors, a bus, memory controller, cache, etc. A multi-core processor may be symmetric or asymmetric.

To enable user interaction, computing system 900 includes an input device 945, which can represent any number of input mechanisms, such as a microphone for speech, a touch-sensitive screen for gesture or graphical input, keyboard, mouse, motion input, speech, etc. Computing system 900 can also include output device 935, which can be one or more of output mechanisms known to those of skill in the art. In some instances, multimodal systems can enable a user to provide multiple types of input/output to communicate with computing system 900. Computing system 900 can include communications interface 940, which can generally govern and manage the user input and system output. There is no restriction on operating on any particular hardware arrangement, and therefore the basic features here may easily be substituted for improved hardware or firmware arrangements as they are developed.

Storage device 930 can be a non-volatile memory device and can be a hard disk or other types of computer-readable media which can store data that are accessible by a computer, such as magnetic cassettes, flash memory cards, solid-state memory devices, digital versatile disks, cartridges, random access memories (RAMs), read-only memory (ROM), and/or some combination of these devices.

The storage device 930 can include software services, servers, services, etc., and when the code that defines such software is executed by the processor 910, it causes the system to perform a function. In some embodiments, a hardware service that performs a particular function can include the software component stored in a computer-readable medium in connection with the necessary hardware components, such as processor 910, connection 905, output device 935, etc., to carry out the function.

For clarity of explanation, in some instances, the present technology may be presented as including individual functional blocks including devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in the memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bitstream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can include, for example, instructions and data which cause or otherwise configure a general-purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can include hardware, firmware, and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

There may be alternative ways to ensure the liquid cooling tubes to be constrained inside the rear rack area when a user services the server. Instead of using the round elastic string that constrains the liquid cooling tubes from moving out of the rack area, a flat elastic ribbon may be used for the same purpose. For example, the strip may be a flat elastic ribbon, which may be stitched to the strap, such as Velcro Strap. The stitching method may be more cost than the round elastic string.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall therebetween.

What is claimed is:

1. A method for constraining liquid cooling tubes, the method comprising:

connecting a first tube connector and a second tube connector with a stretchable strip of flexible material, wherein the first tube connector is configured to fluidly seal to a first end of a liquid cooling tube, and the second tube connector is configured to fluidly seal to a second end of the liquid cooling tube;

connecting the first tube connector to a first manifold and connecting the second tube connector to a second manifold to extend the stretchable strip of flexible material when a computing device in a rack is in operation;

disconnecting the first tube connector from the first manifold and the second tube connector from the second manifold to prepare for the computing device to be serviced, wherein the first tube connector and the second tube connector are constrained by the stretchable strip of flexible material when the computing device is moved out of the rack; and unlocking the computing device from the rack to allow the computing device to slide out of the rack.

2. The method of claim 1, further comprising supplying a coolant in the liquid cooling tube to cool the computing device when the first end of the liquid cooling tube is connected to the first manifold and the second end of the liquid cooling tube is connected to the second manifold.

3. The method of claim 1, wherein the liquid cooling tube is positioned within a cold plate tube.

4. The method of claim 1, wherein the first manifold and the second manifold are in fluid communication with the liquid cooling tube.

5. The method of claim 1, wherein the stretchable strip of flexible material has a constant cross-section.

6. The method of claim 5, wherein the stretchable strip of flexible material has a cross-section in one of a square shape, a rectangular shape, or a circular shape.

7. The method of claim 1, wherein the stretchable strip of flexible material comprises rubber or elastomer.

8. The method of claim 1, wherein the stretchable strip of flexible material comprises a coil spring.

9. The method of claim 1, wherein the first manifold is positioned on a first side of the computing device in the rack, and the second manifold is positioned on a second side of the computing device opposite to the first side.

10. The method of claim 1, wherein the rack comprises a plurality of frames configured to hold a plurality of servers and a plurality of liquid cooling tubes for cooling each of the plurality of servers.

11. The method of claim 10, wherein the first manifold comprises a first plurality of sockets configured to be in fluid communication with a first end of each of the plurality of liquid cooling tubes, and the second manifold comprises a second plurality of sockets configured to be in fluid communication with a second end of each of the plurality of liquid cooling tubes.

12. The method of claim 11, wherein each of the second plurality of sockets is positioned at a fixed distance from respective one of the first plurality of sockets.

13. A device for constraining liquid cooling tubes, the device comprising a stretchable strip of flexible material coupled to a first tube connector and a second tube connector, wherein the first tube connector is configured to connect to a first end of a liquid cooling tube, and the second tube connector is configured to connect to a second end of the liquid cooling tube, wherein the stretchable strip of flexible material is configured to be in a stretch mode when the first tube connector is attached to a first manifold and the second tube connector is attached to a second manifold positioned at a fixed distance from the first manifold, wherein the stretchable strip of flexible material is configured to be in a relaxed mode when the first tube connector is detached from the first manifold and the second tube connector is detached from the second manifold.

14. The device of claim 13, wherein the first and second manifolds are attached to a rack.

15. The device of claim 13, wherein the first tube connector comprises a first plug configured to connect to a first socket of the first manifold, and the second tube connector comprises a second plug configured to connect to a second socket of the second manifold.

16. The device of claim 13, wherein the stretchable strip of flexible material is configured to extend from a first length to a second length when the first tube connector is attached to the first manifold and the second tube connector is attached to the second manifold, wherein the second length of stretchable strip of flexible material is configured to pull the first tube connector and the second tube connector toward each other to return to the first length when the first tube connector is detached from the first manifold and the second tube connector is detached from the second manifold.

17. The device of claim 13, wherein the first manifold is in fluid communication with the first end of the liquid cooling tube and the first end acts as an inlet for a fluid coolant, wherein the second manifold is in a fluid communication with the second end of the liquid cooling tube and the second end acts as an outlet for the fluid coolant.

18. The device of claim 13, wherein the stretchable strip of flexible material has a constant cross-section.

19. The device of claim 18, wherein the cross-section of the stretchable strip of flexible material has one of a square shape, a rectangular shape, or a circular shape.

20. The device of claim 13, wherein the flexible material comprises rubber or elastomer.

* * * * *